(12) United States Patent
Ishii

(10) Patent No.: US 11,642,870 B2
(45) Date of Patent: May 9, 2023

(54) GLASS CARRIER ATTACHED COPPER FOIL AND METHOD FOR PRODUCING SAME

(71) Applicant: MITSUI MINING & SMELTING CO., LTD., Tokyo (JP)

(72) Inventor: Rintaro Ishii, Ageo (JP)

(73) Assignee: MITSUI MINING & SMELTING CO., LTD., Tokyo (JP)

( * ) Notice: Subject to any disclaimer, the term of this patent is extended or adjusted under 35 U.S.C. 154(b) by 0 days.

(21) Appl. No.: 17/042,328

(22) PCT Filed: Mar. 18, 2019

(86) PCT No.: PCT/JP2019/011177
§ 371 (c)(1),
(2) Date: Sep. 28, 2020

(87) PCT Pub. No.: WO2019/188498
PCT Pub. Date: Oct. 3, 2019

(65) Prior Publication Data
US 2021/0008838 A1    Jan. 14, 2021

(30) Foreign Application Priority Data

Mar. 29, 2018 (JP) .............................. JP2018-065830
Nov. 21, 2018 (JP) .............................. JP2018-218451

(51) Int. Cl.
*B32B 15/04* (2006.01)
*H05K 1/09* (2006.01)

(52) U.S. Cl.
CPC ............. *B32B 15/043* (2013.01); *H05K 1/09* (2013.01)

(58) Field of Classification Search
None
See application file for complete search history.

(56) References Cited

U.S. PATENT DOCUMENTS

2005/0048306 A1* 3/2005 Suzuki ................... C25D 1/04
428/548
2013/0071650 A1  3/2013 Liu et al.
(Continued)

FOREIGN PATENT DOCUMENTS

CN      104972713 A    10/2015
CN      105098018      11/2015
(Continued)

OTHER PUBLICATIONS

Production and Characteristics of Grid Band-Pass Filters; M. A. Tarasov, V. D. Gromov, E. A. Otto, and L. S. Kuz'min ;Instruments and Experimental Techniques, 2009, vol. 52, No. 1, pp. 74-78. © Pleiades Publishing, Ltd., 2009. (Year: 2009).*
(Continued)

*Primary Examiner* — Humera N. Sheikh
*Assistant Examiner* — Elizabeth D Ivey
(74) *Attorney, Agent, or Firm* — Greenblum and Bernstein, P.L.C.

(57) ABSTRACT

A glass carrier-attached copper foil is provided that is suitable for production of a desired circuit mounting board ensuring electric conduction over the entire copper layer, reducing separation of the copper layer at the cut edge even if the copper foil is downsized, and having an intended circuit pattern with a fine pitch. The glass carrier-attached copper foil includes a glass carrier, a release layer provided on the glass carrier, and a copper layer provided on the release layer. The release layer has a function to enable release of the copper layer from the glass carrier. The glass carrier-attached copper foil has a plurality of releasable regions including the release layer and an unreleasable region not including the release layer. The unreleasable region has a pattern defining the releasable regions.

18 Claims, 11 Drawing Sheets

(56) References Cited

U.S. PATENT DOCUMENTS

| | | | | |
|---|---|---|---|---|
| 2013/0220679 A1* | 8/2013 | Kawakami | ............... | C25D 5/48 174/255 |
| 2016/0118333 A1* | 4/2016 | Lin | ..................... | H01L 25/16 257/773 |
| 2018/0201005 A1* | 7/2018 | Park | .................. | B29C 66/81427 |
| 2019/0013212 A1 | 1/2019 | Matsuura | | |
| 2019/0029125 A1* | 1/2019 | Matsuura | ............. | H05K 3/4688 |
| 2019/0164876 A1* | 5/2019 | Lee | ..................... | H01L 21/56 |
| 2019/0190140 A1* | 6/2019 | Lavin | ................... | H01Q 9/0485 |

FOREIGN PATENT DOCUMENTS

| | | | |
|---|---|---|---|
| CN | 107031143 A | 8/2017 | |
| CN | 108699673 | 10/2018 | |
| JP | 2000-331537 A | 11/2000 | |
| JP | 2005-76091 A | 3/2005 | |
| JP | 2017-177651 A | 10/2017 | |
| JP | 2018-29184 A | 2/2018 | |
| WO | WO-2017007219 A1 * | 1/2017 | ........... A41D 27/245 |
| WO | 2017/150283 A1 | 9/2017 | |
| WO | 2017/150284 A1 | 9/2017 | |
| WO | WO-2017149811 A * | 9/2017 | ......... C23C 14/0605 |

OTHER PUBLICATIONS

International Search Report issued in International Patent Application No. PCT/JP2019/011177, dated May 28, 2019 and English language translation thereof.

Written Opinion issued in International Patent Application No. PCT/JP2019/011177, dated May 28, 2019 and English language translation thereof.

Taiwanese Office Action issued in Taiwanese application No. 108110385, dated Jan. 20, 2020 and English anguage translation thereof.

* cited by examiner

GLASS CARRIER ATTACHED COPPER FOIL AND METHOD FOR PRODUCING SAME

TECHNICAL FIELD

The present invention relates to a glass carrier-attached copper foil and a method of producing the glass carrier-attached copper foil.

BACKGROUND ART

Printed circuit boards with finer wiring patterns (finer pitches) have been required as electronic devices, such as mobile electronic devices, are compact and advanced. In order to meet such a request, preferred are copper foils for manufacture of printed circuit boards that have smaller thicknesses and lower surface roughness. For example, Patent Document 1 (JP2005-76091A) discloses a method of manufacturing a carrier-attached superthin copper foil, including laminating a release layer and a superthin copper foil in sequence on a smooth face of the copper foil, where the average surface roughness Rz of the copper foil is reduced to 0.01 to 2.0 μm. Patent Document 1 also discloses subjecting the carrier-attached superthin copper foil to a process for formation of a highly dense ultrafine trace (a fine pattern) to produce a multi-layered printed circuit board.

In order to achieve further reductions in thicknesses and surface roughness of superthin copper foils with carriers, it has been also proposed to use, for example, a glass substrate or a polished metal-substrate as a super-smooth carrier instead of a traditional resin carrier that has been typically used, and form a superthin copper layer on the super-smooth carrier by a gas-phase process, for example, by sputtering. For example, Patent Document 2 (WO2017/150283) discloses a carrier-attached copper foil, including, in sequence, a carrier (for example, a glass carrier), a release layer, an antireflective layer, and a superthin copper layer, where the release layer, the antireflective layer, and the superthin copper layer are formed by sputtering. Patent Document 3 (WO2017/150284) discloses a carrier-attached copper foil, including a carrier (for example, a glass carrier), intermediate layers (for example, an adhesive metal layer and a release assisting layer), a release layer, and a superthin copper layer, where the intermediate layers, the release layer, and the superthin copper layer are formed by sputtering. Both Patent Documents 2 and 3 achieve a significantly low arithmetic average roughness Ra of 1.0 to 100 nm of the outer face of the superthin copper layer through formation of the layers on the carrier composed of, for example, glass with superior coplanarity by sputtering.

For example, the laminate of the carrier and the copper layer may come into contact with a certain member during transfer of the carrier-attached copper foil, resulting in unexpected separation of the copper layer. Some copper foils with carriers have been proposed that can address such a problem. For example, the laminate of the carrier and the copper layer may come into contact with a certain member during transfer of the carrier-attached copper foil, resulting in unexpected separation of the copper layer. Some copper foils with carriers have been proposed that can address such a problem. For example, Patent Document 4 (JP2000-331537A) discloses a carrier-attached copper foil, which has a release layer formed to have a smaller thickness at the right and left edge regions of the copper foil as a carrier than that of the release layer in the central region or has no release layer formed at the edge regions, thereby preventing troubles, for example, separation of a copper layer from the carrier during, for example, handling of the carrier-attached copper foil. Patent Document 5 (JP2017-177651A) discloses a release film-attached copper foil, where the copper film has edge regions directly formed on the resin film. Such a configuration does not cause misalignment of the copper film with the resin film and can prevent a trouble of separation of the copper film from the resin film during a production process.

CITATION LIST

Patent Literature

Patent Document 1: JP2005-76091A
Patent Document 2: WO2017/150283
Patent Document 3: WO2017/150284
Patent Document 4: JP2000-331537A
Patent Document 5: JP2017-177651A

SUMMARY OF INVENTION

The dimensions of a substrate that can be processed with a mounting equipment have upper limits for mounting, for example, an IC chip onto the substrate. A typical carrier-attached copper foil has dimensions of, for example, 400 mm by 400 mm, which exceeds the upper limits. Thus, the carrier-attached copper foil is cut into a square with sides of, for example, several tens of millimeters to several hundred millimeters. Unfortunately, the release layer exposed at the cut interface of the carrier-attached copper foil may have low release strength and separation of the copper layer from the carrier may be triggered by a slight scratch, for example, on a face or at an end of the carrier-attached copper foil during cutting of the carrier-attached copper foil. As a result, no intended circuit pattern can be formed, so that the process cannot proceed to the subsequent step. In this regard, a region, to be cut, on the carrier can be masked before formation of these layers so as to be partially free from the release layer. Unfortunately, such an approach also produces a region that is partially free from the copper layer and precludes electric conduction of the entire copper layer. As a result, the production process after stacking may involve troubles, for example, unsuccessful electroplating during formation of a circuit.

The present inventor has discovered that, by providing a glass carrier-attached copper foil with an unreleasable region or cutting margin that is free from a release layer in a predetermined pattern, it is possible to achieve a desired circuit mounting board that ensures electric conduction over the entire copper layer, reduces separation of the copper layer at the cut edge even if the copper foil is downsized, and has an intended circuit pattern with a fine pitch.

An object of the present invention is to provide a glass carrier-attached copper foil suitable for production of a desired circuit mounting board that ensures electric conduction over the enter copper layer, reduces separation of the copper layer at the cut edge even if the copper foil is downsized, and has an intended circuit pattern with a fine pitch.

According to an aspect of the present invention, there is provided a glass carrier-attached copper foil comprising:
a glass carrier;
a release layer provided on the glass carrier; and
a copper layer provided on the release layer,
wherein the release layer has a function to enable release of the copper layer from the glass carrier, and wherein the glass carrier-attached copper foil has a plurality of releasable regions including the release layer and an unreleasable region not including the release layer, the unreleasable region having a pattern defining the releasable regions.

According to another aspect of the present invention, there is provided a method of producing the glass carrier-attached copper foil, comprising the steps of:

providing a glass carrier;

disposing a frame at a predetermined distance above a surface of the glass carrier, the frame having a pattern defining a plurality of regions;

forming the release layer and the copper layer in sequence on the glass carrier by physical vapor deposition (PVD) while holding the frame above the glass carrier, such that the unreleasable region not including the release layer is formed in an area hidden by the frame whereas the releasable regions including the release layer are formed in areas not hidden by the frame, wherein the release layer is deposited to a thickness smaller than that of the copper layer to suppress invasion and deposition of components of the release layer in the area hidden by the frame so as to prevent formation of the release layer in the area hidden by the frame whereas the copper layer is deposited to a thickness larger than that of the release layer to facilitate invasion and deposition of copper in the area hidden by the frame so as to form the copper layer in the area hidden by the frame, and wherein the distance between the frame and the glass carrier and a width of the frame are determined so as to prevent the formation of the release layer in the area hidden by the frame and to allow the formation of the copper layer in the area hidden by the frame.

According to another aspect of the present invention, there is provided a method of producing the glass carrier-attached copper foil, comprising the steps of:

providing a glass carrier;

forming a release layer and a copper layer in sequence on the glass carrier to yield a tentative glass carrier-attached copper foil, an entire region of which is covered with the release layer and the copper layer; and heating the tentative glass carrier-attached copper foil along a pattern defining a plurality of regions such that the release layer present in a region corresponding to the pattern selectively disappears or malfunctions, thereby forming the unreleasable region not including the release layer and the releasable regions including the release layer that remains.

In the following description in this specification, the maximum height Rz as measured in accordance with JIS B 0601-2001 is simply referred to as "maximum height Rz" or merely "Rz".

DESCRIPTION OF EMBODIMENTS

Figure 1:
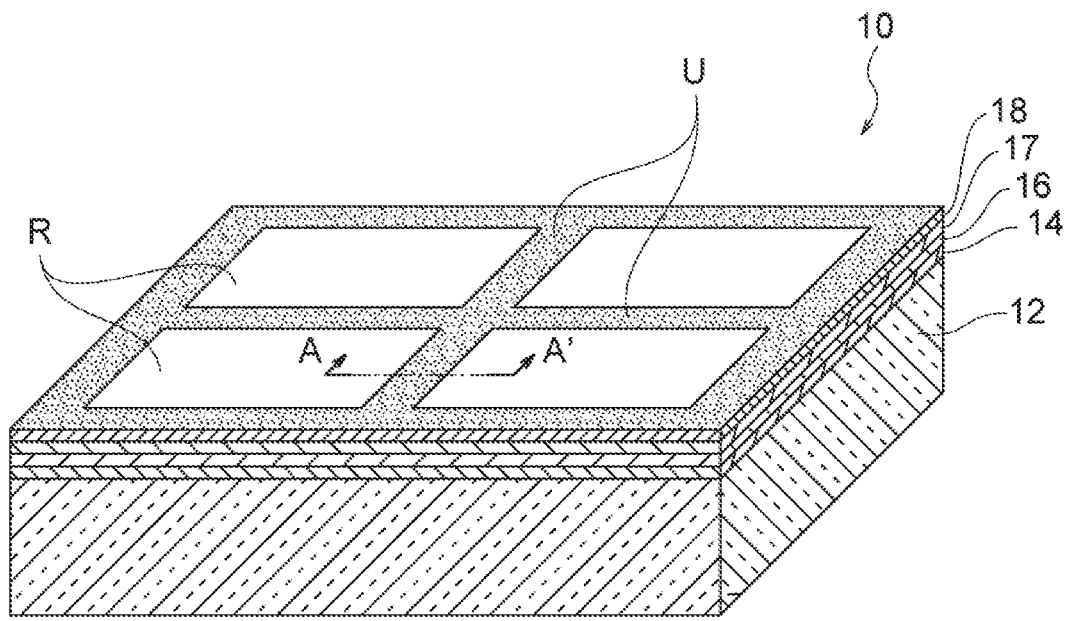
FIG. 1 is a perspective view illustrating a glass carrier-attached copper foil according to an embodiment of the present invention.
Figure 2:
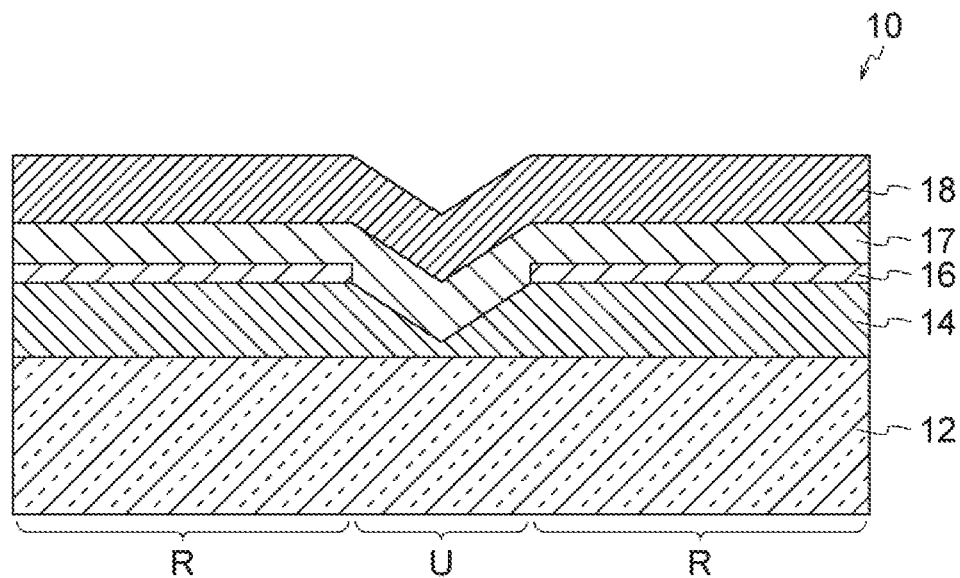
FIG. 2 is a schematic cross-sectional view taken along line A-A' in FIG. 1 and illustrating an exemplary layer configuration of the glass carrier-attached copper foil.

FIGS. 1 and 2 schematically illustrates an exemplary glass carrier-attached copper foil of the present invention. As illustrated in FIGS. 1 and 2, a glass carrier-attached copper foil 10 of the present invention includes, in sequence, a glass carrier 12, a release layer 16, and a copper layer 18. The release layer 16 is provided on the glass carrier 12 and has a function to enable release of the copper layer 18 from the glass carrier 12. The copper layer 18 is provided on the release layer 16. The glass carrier-attached copper foil 10 may further include an intermediate layer 14 between the glass carrier 12 and the release layer 16 as desired. The glass carrier-attached copper foil 10 may further include a functional layer 17 between the release layer 16 and the copper layer 18. In addition, the aforementioned layers may be provided in sequence on two sides of the glass carrier 12 so as to be symmetric about the glass carrier 12. In any case, the glass carrier-attached copper foil 10 of the present invention has a plurality of releasable regions R including the release layer 16 and an unreleasable region U not including the release layer 16, as illustrated in FIGS. 1 and 2. The unreleasable region U has a pattern defining the releasable regions R. The phrase "not including the release layer" refers to the absence of a releasing function or the absence of a material constituting the release layer. The phrase "not including the release layer" encompasses the complete absence of the release layer and the presence of a slight amount of the material constituting the release layer.

Figure 3:
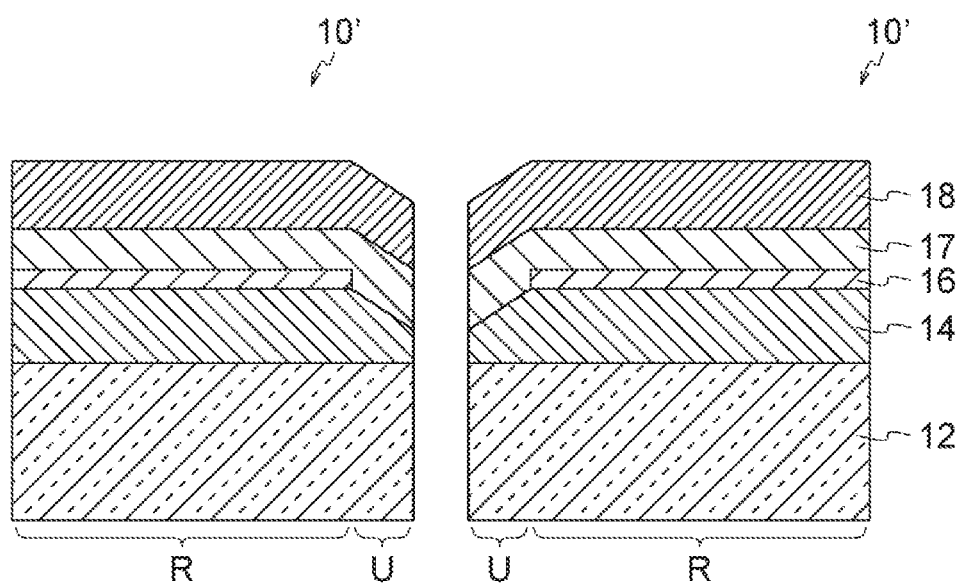
FIG. 3 is a schematic cross-sectional view cut at an unreleasable region of the glass carrier-attached copper foil.

In this way, the unreleasable region U or cutting margin not including the release layer 16 has a predetermined pattern on the glass carrier-attached copper foil. Electric conduction over the entire copper layer 18 can be thereby ensured while a desired circuit mounting board can be achieved that reduces separation of the copper layer 18 at the cut edge even if the copper foil is downsized, and has an intended circuit pattern with a fine pitch. In other words, the glass carrier 12, which originally has a flat face, generates a flat profile of the copper layer 18 stacked above the glass carrier 12 with the release layer 16 therebetween. The flat face of the copper layer 18 enables formation of a fine pattern. Since the unreleasable region U does not have a release layer 16 but has a copper layer 18, portions of the copper layer 18 in the releasable regions R that are used for formation of a fine pattern are electrically connected to the other portion of the copper layer 18 in the unreleasable region U. As a result, electric conduction over the entire copper layer 18 can be ensured and an electroplating process during formation of a circuit can be efficiently carried out. Although the unreleasable region U is defined in the carrier-attached copper foil 10 of the present invention, preferred properties originating from the copper layer 18, for example, electric conductivity are retained. Since the unreleasable region U has a pattern defining the releasable regions R, the glass carrier-attached copper foil 10 can be cut along the pattern of the unreleasable region U into several pieces of glass carrier-attached copper foils 10' each having the releasable region R and downsized to dimensions processable with a mounting equipment. FIG. 3 schematically illustrates two pieces of glass carrier-attached copper foils 10' produced by cutting at an unreleasable region U. As illustrated in FIG. 3, each glass carrier-attached copper foil 10' has a cut plane at the unreleasable region U. Since the unreleasable region U not including the release layer 16 keeps the glass carrier 12 and the copper layer 18 unreleasable from each other, undesired separation of the copper layer 18 from the cut plane can be quite effectively prevented during and after the cutting process (for example, during transfer or handling of the carrier-attached copper foil in a mounting process). As a result, formation of an intended circuit pattern is facilitated and a desired circuit mounting board with a fine pitch can be achieved.

In the glass carrier-attached copper foil 10 of the present invention, the unreleasable region U is preferably designed to be cut along the predetermined pattern such that the glass carrier-attached copper foil 10 is divided into a plurality of pieces. In other words, the glass carrier-attached copper foil 10 of the present invention is preferably cut along the predetermined pattern of the unreleasable region U into a plurality of pieces in the case that downsizing of the copper foil is required for mount of a circuit. The glass carrier-attached copper foil 10 may be cut by any known technique. Examples of the preferred cutting machine include dice cutters, water jet cutters, and laser cutters.

The unreleasable region U has a lattice pattern, a fence pattern, or a cruciform pattern because the plurality of releasable regions R can have equal forms and sizes suitable for a circuit mounting board. The unreleasable region U particularly preferably has a lattice or fence pattern. This enables the unreleasable region U to surround the entire or most peripheries of the discrete releasable regions R. Thus, separation is unlikely to occur at edges of the copper foils 10 with glass carriers after being cut and divided.

Figure 4:
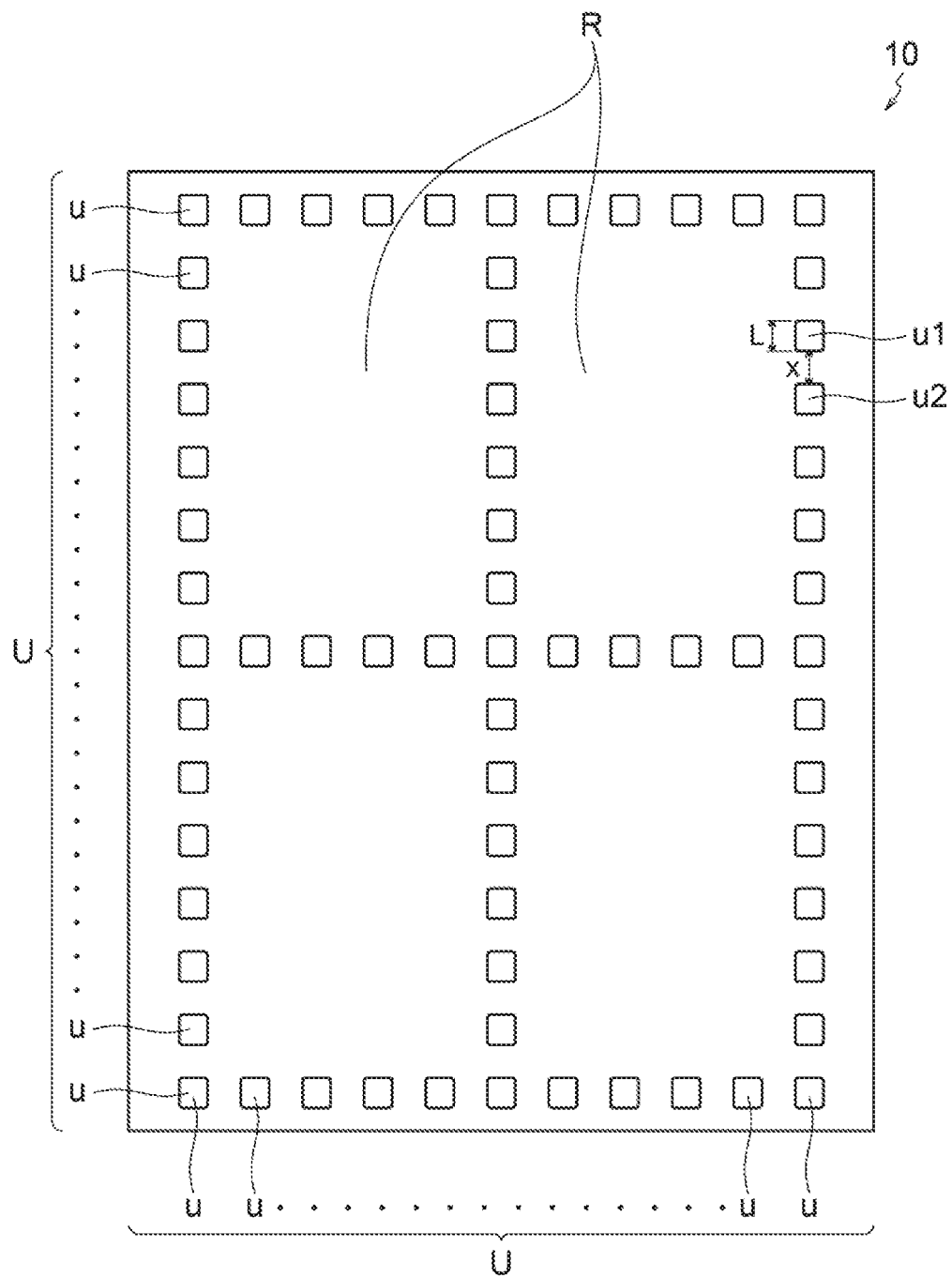
FIG. 4 is a top view illustrating an exemplary carrier-attached copper foil having an unreleasable region with a discontinuous pattern.

As illustrated in FIG. 4, the unreleasable region U may have a discontinuous pattern. The discontinuous pattern includes a plurality of discrete units u that are free from the release layer 16. The units u of the discontinuous pattern may have any shape. Examples of typical shapes of the units u include circles, ellipses, polygons, star polygons, and combination thereof. The units u may each have the same shape or a different shape. The unit u preferably has an area of 100 mm$^2$ or less, more preferably 80 mm$^2$ or less, further preferably 60 mm$^2$ or less, most preferably 40 mm$^2$ or less. Although the area of the unit u may have any lower limit, the lower limit of the area is typically 1 mm$^2$ or more, more typically 4 mm$^2$ or more. The unit u of the discontinuous pattern can be preferably produced by a heating process, for example, laser beam irradiation, which will be described below. As illustrated in FIG. 4, when the units u are arrayed in one direction to define "L" as the length of the unit u in the one direction and to define "x" as the interval between a unit u1 and a unit u2 adjacent to each other in the one direction, the ratio of x to L or x/L may be, for example, 0.1 or more, 0.2 or more, or 0.5 or more, while the ratio x/L may be, for example, 10 or less, 5 or less, or 1 or less.

Figure 5A:
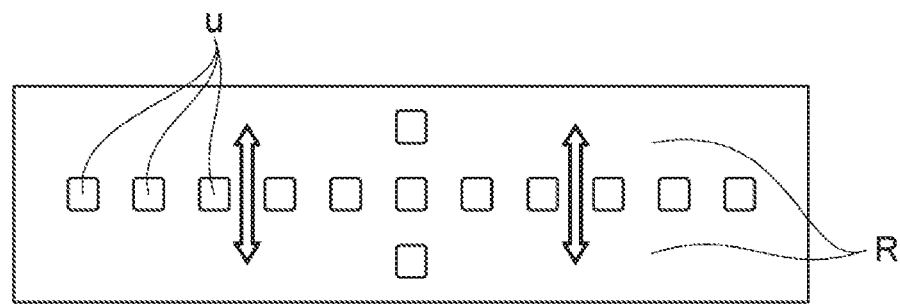
FIG. 5A is a schematic view illustrating force applied to the vicinity of the boundary between a releasable region and an unreleasable region when an insulating material is stacked on the glass carrier-attached copper foil in FIG. 4.
Figure 5B:
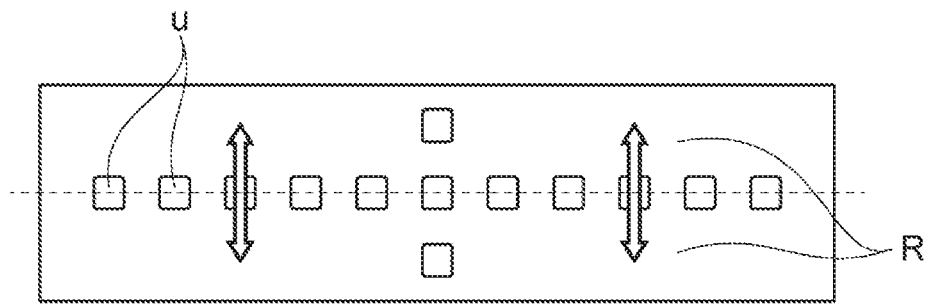
FIG. 5B is a schematic view illustrating force applied to the vicinity of the boundary between the releasable region and the unreleasable region while or after the glass carrier-attached copper foil in FIG. 4 is cut.

The unreleasable region U having a discontinuous pattern can not only prevent separation of the copper layer 18 while or after the carrier-attached copper foil 10 is cut but also effectively suppress unintended separation of the copper layer 18 in the vicinity of the boundary between the releasable region R and the unreleasable region U when the copper layer 18 is tensed in an in-plane direction. In a process of production of a printed circuit board, for example, the insulating material stacked on a carrier-attached copper foil shrinks. The face in contact with the stacked insulating material thereby receives an in-plane force toward the center of the plane. As a result, an excess load is applied to the vicinity of the boundary between the releasable region R and the unreleasable region U. In this regard, the unreleasable region U, which has the discontinuous pattern with the discrete units u, can disperse the force indicated by arrows in FIG. 5A (for example, in-plane force due to shrinkage of the insulating material), without allowing the force to concentrate in the vicinity of the boundary between the releasable region R and the unreleasable region U. As a result, unintended separation of the copper layer 18 in the vicinity of the boundary between the releasable region R and the unreleasable region U can be effectively prevented even if an in-plane tension force is applied. In addition, in the case that the carrier-attached copper foil 10 is cut along the discontinuous pattern of the unreleasable region U, the discrete units u free from the release layer 16 are disposed at the cut plane of the carrier-attached copper foil 10, as indicated by a dotted line in FIG. 5B. Thus, the units u can resist the force in the directions indicated by the arrows in FIG. 5B (for example, force generated by cutting of the carrier-attached copper foil 10 or contacting with a certain member during transfer of the carrier-attached copper foil 10). Hence, unintended separation of the copper layer 18 during or after the cutting process can be prevented.

The pattern of the unreleasable region U preferably has a width of 1 to 50 mm, more preferably 1.5 to 45 mm, further preferably 2.0 to 40 mm, particularly preferably 2.5 to 35 mm. The width in such a range can facilitate positioning of a cutting means, for example, a cutter, onto the unreleasable region U to cut the unreleasable region U, increase the areas of the releasable regions R, and realize the desirable advantages of the unreleasable region U.

In order to keep sufficient areas of releasable regions R, used for formation of a fine pattern, on the copper layer 18, the ratio of the area of the unreleasable region U to the total area of the releasable regions R and the unreleasable region U is preferably 0.01 to 0.5, more preferably 0.02 to 0.45, further preferably 0.05 to 0.40, particularly preferably 0.1 to 0.35.

The glass carrier 12 is composed of glass. The glass carrier 12 may be in the form of a sheet, a film, or a plate. The glass carrier 12 may be a laminate of such sheets, films, or plates. For example, the glass carrier 12 preferably serves as a rigid support, for example, a glass plate. The glass carrier is more preferably composed of a glass material that has a coefficient of thermal expansion (CTE) of less than 25 ppm/K (typically 1.0 to 23 ppm/K) from the viewpoint of prevention of warping of the glass carrier-attached copper foil 10 in a process involving heating. From the viewpoint of ensuring of handling and planarization of the glass carrier during mounting of a chip, the glass carrier 12 preferably has a Vickers hardness of 100 HV or more, more preferably 150 to 2500 HV. The carrier composed of glass has a low weight, a low coefficient of thermal expansion, and high insulation properties, high rigidity, and surface flatness, and thus is advantageous in that the face of the copper layer 18 can be significantly planarized. The carrier composed of glass has other advantages, for example, superior visibility of a copper plating in the image inspection after formation of a wiring layer; coplanarity that is beneficial to mounting of a circuit device; chemical resistance in desmearing and various plating in a manufacturing process of a printed circuit board; and employment of a chemical separation process during release of the glass carrier 12 from the glass carrier-attached copper foil 10. The glass carrier 12 is preferably made of a glass containing $SiO_2$, more preferably 50 wt % or more $SiO_2$, further preferably 60 wt % or more $SiO_2$. Preferred examples of the glass constituting the glass carrier 12 include fused quartz, borosilicate glass, alkali-free glass, soda-lime glass, aminosilicate glass, and combination thereof. More preferred examples of the glass include borosilicate glass, alkali-free glass, soda-lime glass, and combination thereof. Particularly preferred examples of the glass include alkali-free glass, soda-lime glass, and combination thereof. The most preferred glass is alkali-free glass. The glass carrier 12 is preferably composed of borosilicate glass, alkali-free glass, or soda-lime glass because chipping of the glass carrier 12 can be reduced during cutting of the glass carrier-attached copper foil 10. Alkali-free glass is composed mainly of silica dioxide, aluminum oxide, boric oxide, and alkaline-earth metal oxide, such as calcium oxide or barium oxide, and further contains boron. Thus, the alkali-free glass substantially contains no alkali metal. The alkali-free glass has a coefficient of thermal expansion that ranges from 3 to 5 ppm/K in a wide temperature range of 0° C. to 350° C. and is low and stable. Thus, the alkali-free glass has an advantage of minimization of warpage of glass in a process involving heating. The glass carrier 12 preferably has a thickness of 100 to 2000 μm, more preferably 300 to 1800 μm, further preferably 400 to 1100 μm. A thickness in such a range can ensure an appropriate toughness that does not preclude handling of the carrier 22 while achieving thinning of a printed circuit board and a reduction in warpage of the carrier 22 during packaging of an electronic component.

The glass carrier 12 preferably has a face with a maximum height Rz of less than 1.0 μm, more preferably 0.001 to 0.5 μm, further preferably 0.001 to 0.1 μm, still more preferably 0.001 to 0.08 μm, particularly preferably 0.001 to 0.05 μm, most preferably 0.001 to 0.02 μm. In this way, a lower maximum height Rz of the glass carrier 12 can yield a desired low maximum height Rz of the outer face of the copper layer 18 stacked above the glass carrier 12 (in other words, the face remote from the release layer 16). Thus, a printed circuit board produced from the glass carrier-attached copper foil 10 is more suitable for formation of a highly fine wiring pattern having a line (L) of 13 μm or less and a space (S) of 13 μm or less (for example, a line (L) ranging from 12 to 2 μm and a space (S) ranging from 12 to 2 μm).

The intermediate layer 14, which is provided as desired, intervenes between the carrier 12 and the release layer 16 and contributes to the tight adhesion between the carrier 12 and the release layer 16. Examples of the metal constituting the intermediate layer 14 include Cu, Ti, Al, Nb, Zr, Cr, W, Ta, Co, Ag, Ni, In, Sn, Zn, Ga, Mo, and combination thereof (hereinafter referred to as metal M), preferably Cu, Ti, Al, Nb, Zr, Cr, W, Ta, Co, Ag, Ni, Mo, and combination thereof, more preferably Cu, Ti, Zr, Al, Cr, W, Ni, Mo, and combination thereof, further preferably Cu, Ti, Al, Cr, Ni, Mo, and combination thereof, particularly preferably Cu, Ti, Al, Ni, and combination thereof. The intermediate layer 14 may be composed of an elemental metal or an alloy. The metal constituting the intermediate layer 14 may contain incidental impurities originated from, for example, components contained in a material and formed during a process for formation of the layer. After formation and subsequent exposure of the intermediate layer 14 to air, atmospheric oxygen may be incorporated into the intermediate layer 14. The content of the metal may have any upper limit and may be 100 at %. The intermediate layer 14 is preferably formed by physical vapor deposition (PVD), more preferably by sputtering. A particularly preferred intermediate layer 14 is formed by magnetron sputtering using a metal target to improve the uniformity of the thickness of the intermediate layer 14. The intermediate layer 14 preferably has a thickness of 10 to 1000 nm, more preferably 30 to 800 nm, further preferably 60 to 600 nm, particularly preferably 100 to 400 nm. The thickness is determined by cross-sectional observation of the intermediate layer 14 with a transmission electron microscope provided with an energy dispersive X-ray spectroscopic analyzer (TEM-EDX).

The intermediate layer 14 may have a monolayer configuration or a multilayer configuration. In the case that the intermediate layer 14 has a monolayer configuration, the intermediate layer 14 is preferably a metal-containing layer composed of Cu, Al, Ti, Ni, or combination thereof (for example, an alloy or an intermetallic compound), more preferably composed of Al, Ti, or combination thereof (for example, an alloy or an intermetallic compound), further preferably a layer mainly containing Al or a layer mainly containing Ti. In the case that the intermediate layer 14 is composed of a metal or an alloy having insufficient adhesion to the glass carrier 12, the intermediate layer 14 preferably has a bilayer configuration. In other words, one sublayer composed of a metal (for example, Ti) or an alloy having high adhesion to the glass carrier 12 adjoins the glass carrier 12 and another sublayer composed of a metal (for example, copper) or an alloy having low adhesion to the glass carrier 12 adjoins the release layer 16, resulting in improved adhesion to the glass carrier 12. Thus, an exemplary bilayer configuration of the intermediate layer 14 has a laminate structure consisting of a Ti-containing sublayer adjoining the glass carrier 12 and a Cu-containing sublayer adjoining the release layer 16. Since a variation in the proportion of the constituent elements in or the thicknesses of the two sublayers leads to a variation in the release strength, it is preferred to appropriately adjust the proportion of the constituent elements in or the thickness of each sublayer. Throughout this specification, the category of "layers containing the metals M" includes layers composed of alloys containing other elements in addition to the metals M in an amount that does not impair the releasability of the carrier. In other words, the intermediate layer 14 mainly contains a metal M. From this viewpoint, the content of the metal M in the intermediate layer 14 is preferably 50 to 100 at %, more preferably 60 to 100 at %, further preferably 70 to 100 at %, particularly preferably 80 to 100 at %, most preferably 90 to 100 at %.

In the case that the intermediate layer 14 is composed of an alloy, a preferred example of the alloy is a Ni alloy. The Ni content in the Ni alloy is preferably 45 to 98 wt %, more preferably 55 to 90 wt %, further preferably 65 to 85 wt %. The Ni alloy is preferably composed of Ni and at least one element selected from the group consisting of Cr, W, Ta, Co, Cu, Ti, Zr, Si, C, Nd, Nb, and La, more preferably Ni and at least one element selected from the group consisting of Cr, W, Cu, and Si. In the case that the intermediate layer 14 is composed of a Ni alloy, it is particularly preferred to form an intermediate layer 14 by magnetron sputtering using a Ni alloy target because the intermediate layer can have a more uniform thickness.

The release layer 16 has a function to enable release of the copper layer 18 from the glass carrier 12. Since the release layer 16 is present in the releasable regions R, the releasable regions R can be regarded as regions having a function to enable release of the copper layer 18 from the glass carrier 12. Since the release layer 16 is absent in the unreleasable region U, the unreleasable region U can be regarded as a region having no function to release the glass carrier 12 from the copper layer 18. Meanwhile, a layer having no function to enable release the glass carrier 12 from the copper layer 18 is not regarded as a release layer 16 even if being present between the carrier 12 and the copper layer 18. Thus, components of the release layer 16 may be contained in the unreleasable region U as long as the region U has no function to release the glass carrier 12 from the copper layer 18. Such examples includes a case where a slight amount of component of the release layer 16 is present or distributed in the unreleasable region U such that the layer does not exhibit the releasing function and a case where the release layer 16 has lost the releasing function afterward so as no longer to be called the release layer 16.

The release layer 16 may be composed of a known material used in a release layer of a typical carrier-attached copper foil. The release layer 16 may be organic or inorganic. Examples of the organic component used in the organic release layer include nitrogen-containing organic compounds, sulfur-containing organic compounds, and carboxylic acid. Examples of the nitrogen-containing organic compounds include triazole compounds and imidazole compounds. Examples of the inorganic component used in the inorganic release layer include oxides of at least one metal selected from the group consisting of Ni, Mo, Co, Cr, Fe, Ti, W, P, Zn, Cu, Al, Nb, Zr, Ta, Ag, In, Sn, and Ga, and carbon. Among them, the release layer 16 is preferably a carbon layer, i.e., a layer mainly containing carbon from the viewpoint of releasability and film formability, more preferably a layer mainly composed of carbon or hydrocarbon, further preferably a hard carbon layer composed of amorphous carbon. In this case, the carbon content in the release layer 16 (in other words, the carbon layer) is preferably 60 at % or more, more preferably 70 at % or more, further preferably 80 at % or more, particularly preferably 85 at % or more, as measured by X-ray photoelectron spectroscopy (XPS). The carbon content may have any upper limit, for example, 100 at % and is practically 98 at % or less. The release layer 16 (in particular, the carbon layer) may contain incidental impurities (for example, oxygen and hydrogen originated from an ambient environment, such as an atmosphere). Metal atoms originated from a process for formation of the functional layer 17 or the copper layer 18 may be incorporated into the release layer 16 (in particular, the carbon layer). Carbon is less diffusible to and less reactive with the carrier. Even during a high-temperature press process above 300° C., the release layer 16 can prevent formation of a metallic bond between the copper foil and a bonded interface and keep the carrier readily releasable. A preferred release layer 16 is also formed by a gas-phase process, for example, by sputtering to suppress incorporation of excess incidental impurities in amorphous carbon and to keep continuous formation of the intermediate layer 14 provided as desired. The release layer 16 (in particular, the carbon layer) preferably has a thickness of 1 to 20 nm, more preferably 1 to 10 nm. The thickness is determined by cross-sectional observation of the release layer 16 with a transmission electron microscope provided with an energy dispersive X-ray spectroscopic analyzer (TEM-EDX).

The functional layer 17 may be provided between the release layer 16 and the copper layer 18 as desired. The functional layer 17 may be any layer imparting a desired function, for example, an etching stopping function or an antireflective function to the glass carrier-attached copper foil 10. Preferred examples of a metal constituting the functional layer 17 include Ti, Al, Nb, Zr, Cr, W, Ta, Co, Ag, Ni, Mo, and combination thereof. More preferred are Ti, Zr, Al, Cr, W, Ni, Mo, and combination thereof. Further preferred are Ti, Al, Cr, Ni, Mo, and combination thereof. Particularly preferred are Ti, Mo, and combination thereof. These elements are insoluble in a copper flash etching solution, resulting in a high chemical resistance against the copper flash etching solution. Thus, the functional layer 17 is less etched by the copper flash etching solution than the copper layer 18 and can thus serve as an etching stopper layer. Since the aforementioned metal constituting the functional layer 17 can prevent light reflection, the functional layer 17 can serve as an antireflective layer to enhance visibility in an image inspection (for example, an automated optical inspection (AOI)). The functional layer 17 may be composed of an elemental metal or an alloy. The metal constituting the functional layer 17 may contain incidental impurities originated from, for example, components contained in a material and formed during a process for formation of the layer. The content of the metal may have any upper limit, for example, 100 at %. The functional layer 17 may be preferably formed by physical vapor deposition (PVD), more preferably by sputtering. The functional layer 17 preferably has a thickness of 1 to 500 nm, more preferably 10 to 400 nm, further preferably 30 to 300 nm, particularly preferably 50 to 200 nm.

The copper layer 18 is composed of copper. The copper layer 18 may contain incidental impurities originated from, for example, components contained in a material and formed during a process for formation of the layer. The copper layer 18 may be produced by any process, for example, a wet process, such as electroless copper plating or electrolytic copper plating, a physical vapor deposition (PVD), such as sputtering or vacuum vapor deposition, a chemical vapor deposition, or combination thereof. A particularly preferred copper layer is formed by physical vapor deposition (PVD), such as sputtering or vacuum vapor deposition, to achieve a fine pitch through thinning of the copper foil. Most preferred is a copper layer formed by sputtering. The copper layer 18 is preferably unroughened. Alternatively, the copper layer may be roughened by preliminary roughening, soft etching, washing, or oxidation-reduction within a scope not precluding the formation of a wiring pattern during manufacturing of a printed circuit board. In order to achieve a fine pitch described above, the copper layer 18 preferably has a thickness of 0.05 to 3.0 µm, more preferably 0.10 to 2.5 µm, further preferably 0.15 to 2.0 µm, still more preferably 0.20 to 1.5 µm, particularly preferably 0.25 to 1.25 µm, most preferably 0.28 to 1.0 µm. The copper layer 18 having a thickness in such a range is preferably formed by sputtering from the viewpoint of the uniformity of the thickness of the formed layer and production of a sheeted or rolled copper foil. The outer face of the copper layer 18 preferably has a maximum height Rz of less than 1.0 µm, more preferably 0.001 to 0.5 µm, further preferably 0.001 to 0.1 µm, still more preferably 0.001 to 0.08 µm, particularly preferably 0.001 to 0.05 µm, most preferably 0.001 to 0.02 µm. Such a maximum height Rz is significantly advantageous for achieving a fine pitch.

The intermediate layer 14 (if present), the release layer 16, the functional layer 17 (if present), and the copper layer 18 are preferably films formed by physical vapor deposition (PVD), more preferably formed by sputtering.

Production of Glass Carrier-Attached Copper Foil

The glass carrier-attached copper foil 10 of the present invention may be produced by any method. Preferred methods of production according to a first embodiment and a second embodiment will now be described.

Production According to First Embodiment

In the method of producing the glass carrier-attached copper foil according to the first embodiment, a predetermined frame is disposed above the glass carrier to form various layers in sequence. The glass carrier-attached copper foil, having releasable regions R and an unreleasable region U is thereby produced. In detail, the method of producing the glass carrier-attached copper foil 10 according to the first embodiment involves the steps of (A-1) providing a glass carrier, (A-2) disposing a frame with a predetermined pattern above the glass carrier, and (A-3) forming layers on the glass carrier by physical vapor deposition (PVD) while holding the frame above the carrier. The details of these steps will now be explained.

(A-1) Providing Glass Carrier

A glass carrier 12 is provided. The glass carrier 12 preferably has at least one flat face with a maximum height Rz of less than 1.0 µm, more preferably 0.001 to 0.5 µm, further preferably 0.001 to 0.1 µm, still more preferably 0.001 to 0.08 µm, particularly preferably 0.001 to 0.05 µm, most preferably 0.001 to 0.02 µm. Since glass products usually have superior flatness, a commercially available glass sheet, film, or plate that satisfies a maximum height Rz within such a range may be used as a glass carrier 12. Alternatively, the glass carrier 12 that does not satisfy the maximum height Rz within the range may be subjected to a known surface polishing process to achieve a maximum height Rz within the range. The preferred materials and properties of the glass carrier 12 have been described above.

(A-2) Disposing Frame

Figure 6:
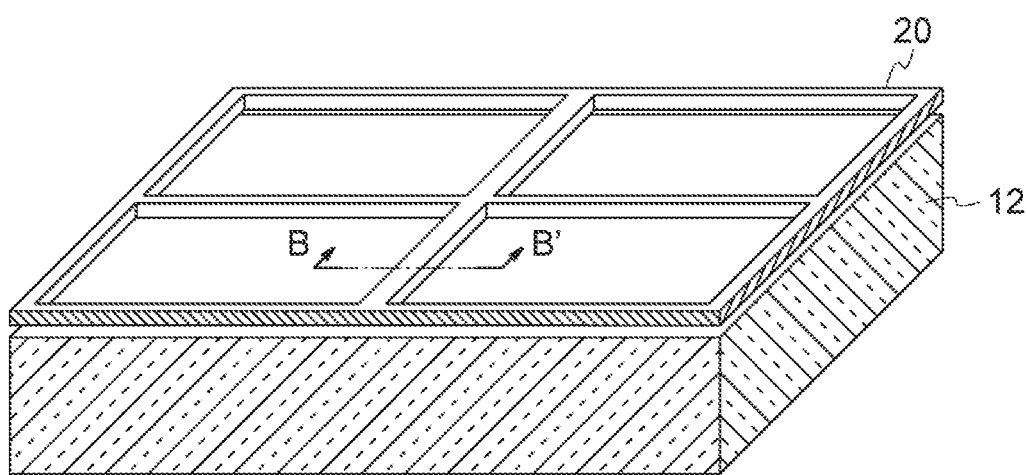
FIG. 6 is a perspective view schematically illustrating the glass carrier and a frame disposed above the glass carrier.
Figure 7:
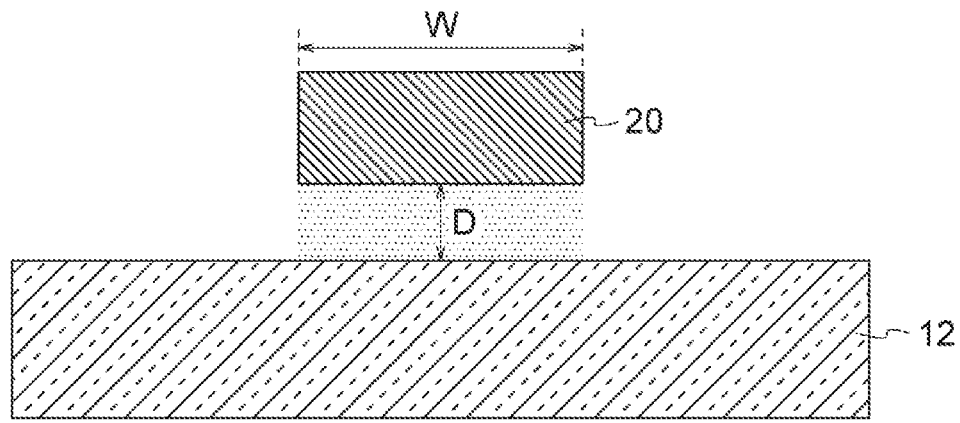
FIG. 7 is a schematic cross-sectional view taken along line B-B' in FIG. 6 and illustrating a layout of the glass carrier and the frame.

As schematically illustrated in FIGS. 6 and 7, a frame 20 having a pattern defining a plurality of regions is disposed at a predetermined distance above the glass carrier 12. The frame 20 can thereby substantially prevent invasion and deposition of layer components in an area hidden by the frame 20 (a dotted area in FIG. 7) in the case of formation of a thin layer by physical vapor deposition (PVD). In contrast, the frame 20 disposed above the carrier permits entry of sufficient amounts of layer components from the periphery of the frame 20 in the case of formation of a thick layer by physical vapor deposition (PVD). Thus, the layer components invade and deposit also in the area hidden by the frame 20. As a result, it is possible to selectively suppress formation of a thin layer (for example, a release layer 16) in the area hidden by the frame 20, while allowing formation of a thick layer (for example, an intermediate layer 14, a functional layer 17, or a copper layer 18) in this area, in the case of sequential deposition of layers through the single frame 20 held at a predetermined position. Thus, the glass carrier-attached copper foil 10 of the present invention can be efficiently produced at a low cost compared to the case where a face of the glass carrier 12 is masked immediately before formation of the release layer 16 and then the mask is removed immediately after formation of the release layer 16. The frame 20 is preferably composed of a metal, which has a high rigidity. Preferred examples of the metal include stainless steels (SUS series in accordance with JIS), Al, Ni, Cr, Cu, Ti, Mo, W, Ta, and combination and alloys of these metals. Deflection of the frame 20 can be thereby suppressed and the unreleasable region U having a desired pattern can be reproducibly formed.

Figure 8A:
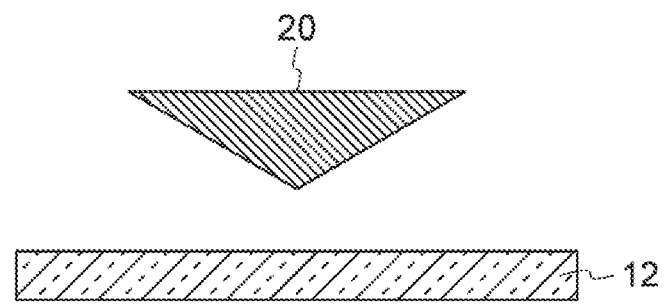
FIG. 8A is a schematic cross-sectional view illustrating an exemplary frame having an inversely tapered cross-section.
Figure 8B:
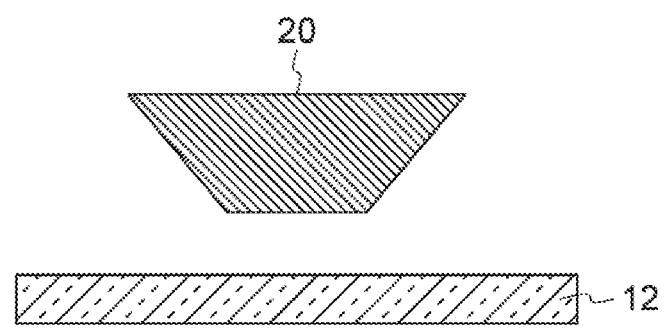
FIG. 8B is a schematic cross-sectional view illustrating another exemplary frame having an inversely tapered cross-section.
Figure 8C:
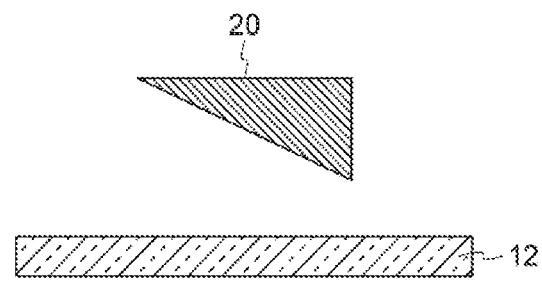
FIG. 8C is a schematic cross-sectional view illustrating still another exemplary frame having an inversely tapered cross-section.
Figure 8D:
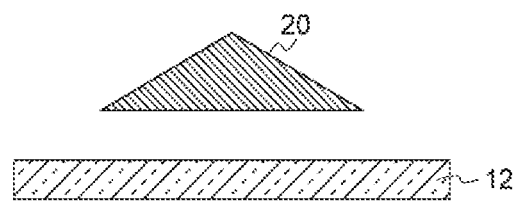
FIG. 8D is a schematic cross-sectional view illustrating an exemplary frame having a tapered cross-section.
Figure 8E:
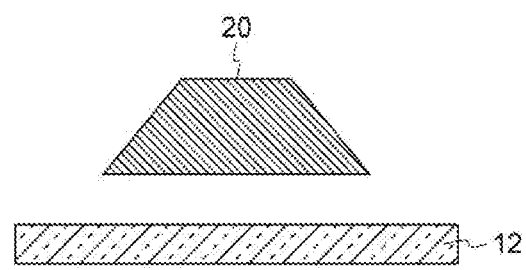
FIG. 8E is a schematic cross-sectional view illustrating another exemplary frame having a tapered cross-section.
Figure 8F:
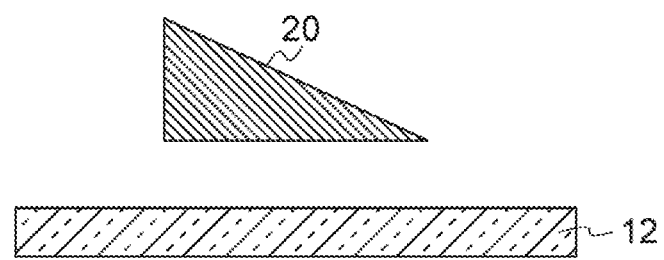
FIG. 8F is a schematic cross-sectional view illustrating still another exemplary frame having a tapered cross-section.

In order to selectively suppress formation of the release layer 16 in the area hidden by the frame 20, the distance D between the glass carrier 12 and the frame 20 (the shortest distance, indicated by an arrow in FIG. 7, between a face of the glass carrier 12 and the frame 20) and the width W of the frame 20 are determined so as to prevent the formation of the release layer 16 in the area hidden by the frame 20 but to allow the formation of the copper layer 18. In this regard, a shorter distance between the glass carrier 12 and the frame 20 or a larger width of the frame 20 can reduce layer components invading and depositing in the area hidden by the frame 20. Thus, the distance between the glass carrier 12 and the frame 20 and the width of the frame 20 may be adjusted such that, in the area hidden by the frame 20, formation of the release layer 16 is prevented by the frame 20 whereas formation of the copper layer 18 is allowed by way of the layer components invading from the periphery of the frame 20. The phrase "width of the frame" refers to the length W in the transverse direction at any longitudinal portion composing of the frame 20 as illustrated in FIG. 7 but not the entire length of the frame 20 with a plurality of longitudinal portions. It is preferred that the frame 20 and/or the glass carrier 12 be supported by a mechanism adjusting the distance therebetween. The distance between the frame 20 and the glass carrier 12 and the width of the frame 20 may be determined depending on, for example, thicknesses of the release layer 16 and the copper layer 18 to be formed. The distance between the glass carrier 12 and the frame 20 is typically 1 to 50 mm, more typically 1 to 10 mm. The width of the frame 20 is typically 1 to 50 mm, more typically 1 to 30 mm. As schematically illustrated in FIGS. 8A to 8C, the frame 20 may have an inversely tapered cross-section whose width increases with distance from the face of the glass carrier 12. As schematically illustrated in FIGS. 8D to 8F, the frame 20 may alternatively have a tapering cross-section whose width decreases with distance from the face of the glass carrier 12. In other words, the frame 20 may have not only a rectangular cross-section as illustrated in FIG. 7 but also a modified cross-section, for example, a triangular or trapezoidal cross-section as illustrated in FIGS. 8A to 8F. In the case that the frame has a cross-section other than a rectangular cross-section, for example, a triangular or trapezoidal cross-section as illustrated in FIG. 8A to FIG. 8F, the largest length in the transverse direction of the longitudinal portions composing of the frame (in other words, the largest width of the frame) is defined as the width of the frame.

(A-3) Forming Layers on Glass Carrier

While the frame 20 is held at a predetermined distance above the glass carrier 12, the intermediate layer 14 as desired, the release layer 16, the functional layer 17 as desired, and the copper layer 18 are formed on the glass carrier 12 by physical vapor deposition (PVD), resulting in a glass carrier-attached copper foil 10. The release layer 16 is deposited to a thickness smaller than that of the copper layer 18 to suppress invasion and deposition of the components of the release layer 16 in the area hidden by the frame 20 so as to prevent the formation of the release layer 16 in the area hidden by the frame 20. In contrast, the copper layer 18 is deposited to a thickness larger than that of the release layer 16 so as to facilitate invasion and deposition of the components of the copper layer 18 in the area hidden by the frame 20 to form the copper layer 18 in the area hidden by the frame 20. In this way, an unreleasable region U not including a release layer 16 is formed in the area hidden by the frame 20 whereas releasable regions R including a release layer 16 are formed in areas not hidden by the frame 20. It is preferred that the intermediate layer 14 and/or the functional layer 17 be deposited to a thickness larger than that of release layer 16 as in formation of the copper layer 18. Examples of the physical vapor deposition (PVD) include sputtering, vacuum vapor deposition, and ion plating. The sputtering process is most preferred from the viewpoint of, for example, control of the thickness of a film in a wide range, such as 0.05 to 5000 nm, and ensuring a uniform thickness of the film over a large width or area. In particular, formation of all the intermediate layer 14 (if present), the release layer 16, the functional layer 17 (if present), and copper layer 18 by sputtering significantly enhances production efficiency. Since the frame 20 is disposed at a predetermined distance above the glass carrier 12 before deposition of the layers as described above, masking of a face of the carrier 12 right before formation of the release layer 16 and removal of the mask right after formation of the release layer 16 are unnecessary. As a result, the layers can be efficiently formed in a vacuum. A layer may be formed by any physical vapor deposition (PVD) process with a known vapor deposition system under known conditions. For example, any known sputtering process, such as magnetron sputtering, two-electrode sputtering, or facing target sputtering, may be employed. The magnetron sputtering is preferred because it has a high deposition rate and a high productivity. The sputtering process may be carried out with either direct-current (DC) power or radio-frequency (RF) power. The target may be, for example, a well-known plate target. From the viewpoint of efficiency of use, a cylindrical target is preferably used. Formation of the intermediate layer 14 (if present), the release layer 16, the functional layer 17 (if present), and the copper layer 18 by physical vapor deposition (PVD) (preferably by sputtering) will now be described.

In the PVD, the intermediate layer 14 is preferably formed by magnetron sputtering under a non-oxidizing atmosphere using a target composed of at least one metal selected from the group consisting of Cu, Ti, Al, Nb, Zr, Cr, W, Ta, Co, Ag, Ni, In, Sn, Zn, Ga, and Mo because the intermediate layer 14 has a highly uniform thickness. The target preferably has a purity of at least 99.9%. The gas used in the sputtering process is preferably an inert gas, for example, gaseous argon. Any flow rate of the gaseous argon may be appropriately determined depending on the volume of a sputtering chamber and the conditions for formation of a film. A pressure ranging from 0.1 to 20 Pa is preferably applied during formation of the film to keep continuous formation of the film without operational failure of the vapor deposition system, such as abnormal electric discharge or defective plasma irradiation. The pressure range may be determined by adjustments of the deposition power and the flow rate of the gaseous argon depending on, for example, the structure and capacity of the system, the evacuation capacity of the vacuum pump, and the rating capacity of the deposition power. The sputtering power may be appropriately determined within a range of 0.05 to 10.0 W/cm$^2$ per unit area of the target in view of, for example, the uniformity of the thickness of the film and the productivity of formation of the film.

The release layer 16 is preferably formed by physical vapor deposition (PVD) (preferably by sputtering) using a carbon target under an inert atmosphere, for example, an argon atmosphere. The carbon target is preferably composed of graphite that may contain incidental impurities (for example, oxygen and carbon originated from an ambient environment, such as an atmosphere). The carbon target preferably has a purity of at least 99.99%, more preferably at least 99.999%. A pressure ranging from 0.1 to 2.0 Pa is preferably applied during formation of a film to keep continuous formation of the film without operational failure of the vapor deposition system, such as abnormal electric discharge or defective plasma irradiation. The pressure range may be determined by adjustments of the deposition power and the flow rate of the gaseous argon depending on, for example, the structure and capacity of the system, the evacuation capacity of the vacuum pump, and the rating capacity of the deposition power. The sputtering power may be appropriately determined within a range of 0.05 to 10.0 W/cm$^2$ per unit area of the target in view of, for example, the uniformity of the thickness of the film and the productivity of formation of the film.

In the PVD, the functional layer 17 is preferably formed by magnetron sputtering using a target composed of at least one metal selected from the group consisting of Ti, Al, Nb, Zr, Cr, W, Ta, Co, Ag, Ni, and Mo. The target preferably has a purity of at least 99.9%. In particular, the functional layer 17 is preferably formed by magnetron sputtering under an inert gas atmosphere, for example, an argon atmosphere under a pressure of 0.1 to 20 Pa. The sputtering pressure is more preferably 0.2 to 15 Pa, further preferably 0.3 to 10 Pa. The pressure range may be determined by adjustments of the deposition power and the flow rate of the gaseous argon depending on, for example, the structure and capacity of the system, the evacuation capacity of the vacuum pump, and the rating capacity of the deposition power. Any flow rate of the gaseous argon may be appropriately determined depending on the volume of the sputtering chamber and the conditions for formation of a film. The sputtering power may be appropriately determined within a range of 1.0 to 15.0 W/cm$^2$ per unit area of the target in view of, for example, the uniformity of the thickness of the film and the productivity of formation of the film. The temperature of the carrier is preferably kept constant during formation of the film for achievement of uniform properties of the film (for example, the uniform resistance and crystal size of the film). The temperature of the carrier during formation of the film is preferably adjusted within a range of 25 to 300° C., more preferably 40 to 200° C., further preferably 50 to 150° C.

The copper layer 18 is preferably formed by physical vapor deposition (PVD) (preferably by sputtering) using a copper target under an inert atmosphere, for example, an argon atmosphere. The copper target is preferably composed of elemental copper that may contain incidental impurities. The copper target preferably has a purity of at least 99.9%, more preferably at least 99.99%, further preferably at least 99.999%. In order to prevent an increase in temperature during formation of the copper layer 18 by physical vapor deposition, a mechanism maybe provided for cooling the stage in the vapor deposition system. A pressure ranging from 0.1 to 2.0 Pa is preferably applied during formation of a film to keep continuous formation of the film without operational failure of the vapor deposition system, such as abnormal electric discharge or defective plasma irradiation. The pressure range may be determined by adjustments of the deposition power and the flow rate of the gaseous argon depending on, for example, the structure and capacity of the system, the evacuation capacity of the vacuum pump, and the rating capacity of the deposition power. The sputtering power may be appropriately determined within a range of 0.05 to 10.0 W/cm$^2$ per unit area of the target in view of, for example, the uniformity of the thickness of the film and the productivity of formation of the film.

Production According to Second Embodiment

In the method of producing the glass carrier-attached copper foil according to the second embodiment, layers are formed on the glass carrier, resulting in a tentative glass carrier-attached copper foil. The tentative glass carrier-attached copper foil is heated along a predetermined pattern, resulting in a glass carrier-attached copper foil having releasable regions R and an unreleasable region U. In detail, the method of producing the glass carrier-attached copper foil 10 according to the second embodiment involves the steps of (B-1) providing a glass carrier, (B-2) forming layers in sequence on the glass carrier, to form a tentative glass carrier-attached copper foil, and (B-3) heating the tentative glass carrier-attached copper foil along a predetermined pattern. The details of these steps will now be described.

(B-1) Providing Glass Carrier

A glass carrier 12 is provided. A preferred glass carrier 12 has been described in Step A-1 of the method of production according to the first embodiment.

(B-2) Forming Layers on Glass Carrier

An intermediate layer 14 as desired, a release layer 16, a functional layer 17 as desired, and a copper layer 18 are formed in sequence on the glass carrier 12 to form a tentative glass carrier-attached copper foil, an entire region of which is covered with the release layer 16 and the copper layer 18. In the case that the intermediate layer 14 and/or the functional layer 17 are formed, the intermediate layer 14 and/or the functional layer 17 may be present over the entire tentative glass carrier-attached copper foil. Each of the intermediate layer 14 (if present), the release layer 16, the functional layer 17 (if present), and the copper layer 18 is preferably formed by physical vapor deposition (PVD) from the viewpoint of achieving a fine pitch through thinning of the copper foil. A preferred process for formation of the layers by physical vapor deposition (PVD) has been described in Step A-3 of the method of production according to the first embodiment.

(B-3) Heating Process

Figure 9:
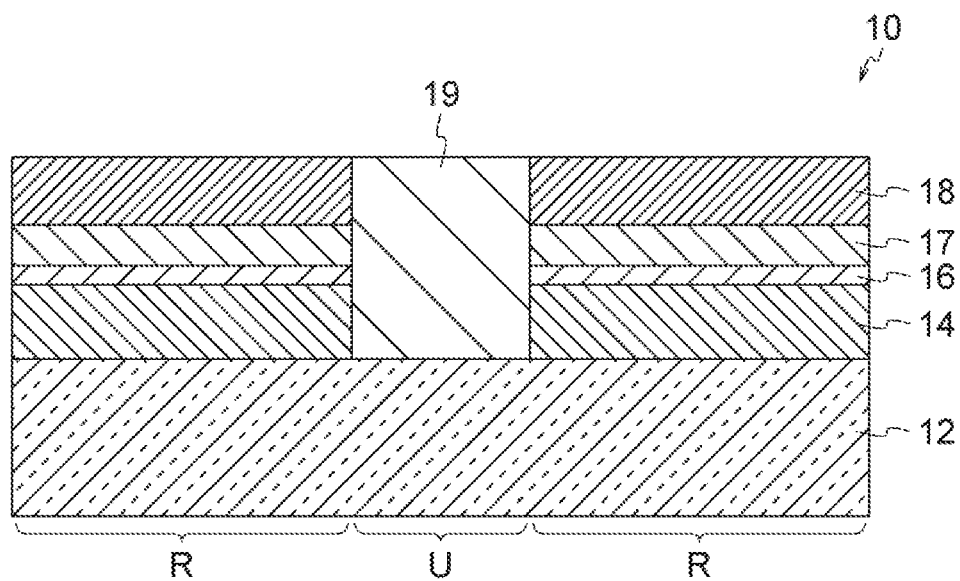
FIG. 9 is a schematic cross-sectional view taken along line A-A' in FIG. 1 and illustrating another exemplary layer configuration of the glass carrier-attached copper foil.

The tentative glass carrier-attached copper foil is heated along a pattern defining a plurality of regions. The release layer 16 that is present in a region corresponding to the pattern selectively disappears or malfunctions. An unreleasable region U not including the release layer 16 and the releasable regions R including the release layer 16 that remains are thereby formed. Heating diffuses metal elements originated from various layers through the release layer 16. As schematically illustrated in FIG. 9, the layers are thereby alloyed into an alloy layer 19. As a result, the release layer 16 in the heated area may disappear or malfunction. Thus, the temperature and time for heating to forcibly cause metal diffusion in the layers and form the alloy layer 19 may be appropriately determined depending on the thickness of the release layer 16 and the types of metal elements constituting the other layers. Heating is preferably carried out by laser beam irradiation, which can selectively and efficiently form the unreleasable region U along a desired pattern.

EXAMPLES

The present invention will now be described in more detail by the following Example.

Example 1

As illustrated in FIG. 1, an intermediate layer 14 (including a Ti-containing sublayer and a Cu-containing sublayer), a carbon layer as a release layer 16, a functional layer 17, and a copper layer 18 were formed in sequence on a glass carrier 12 to prepare a glass carrier-attached copper foil 10, having a releasable regions R and an unreleasable region U. The procedures will be detailed below. It should be noted that the maximum height Rz to be mentioned in the following Example is measured in accordance with JIS B 0601-2001 with a non-contact surface profiler (NewView 5032 available from Zygo Corporation).

(1) Providing Glass Carrier

A glass sheet was provided that had a flat face with a maximum height Rz of 2.7 nm, dimensions of 200 mm by 250 mm, and a thickness of 1.1 mm (material: soda-lime glass available from Central Glass Co., Ltd.).

(2) Disposing Frame

Figure 10A:
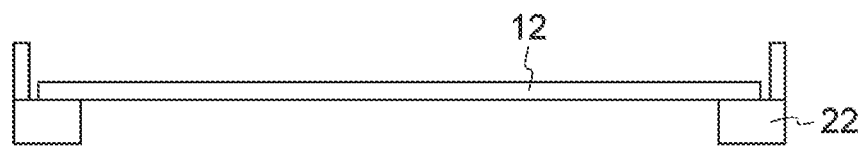
FIG. 10A is a schematic cross-sectional view illustrating a support and a glass carrier disposed on the support.
Figure 10B:
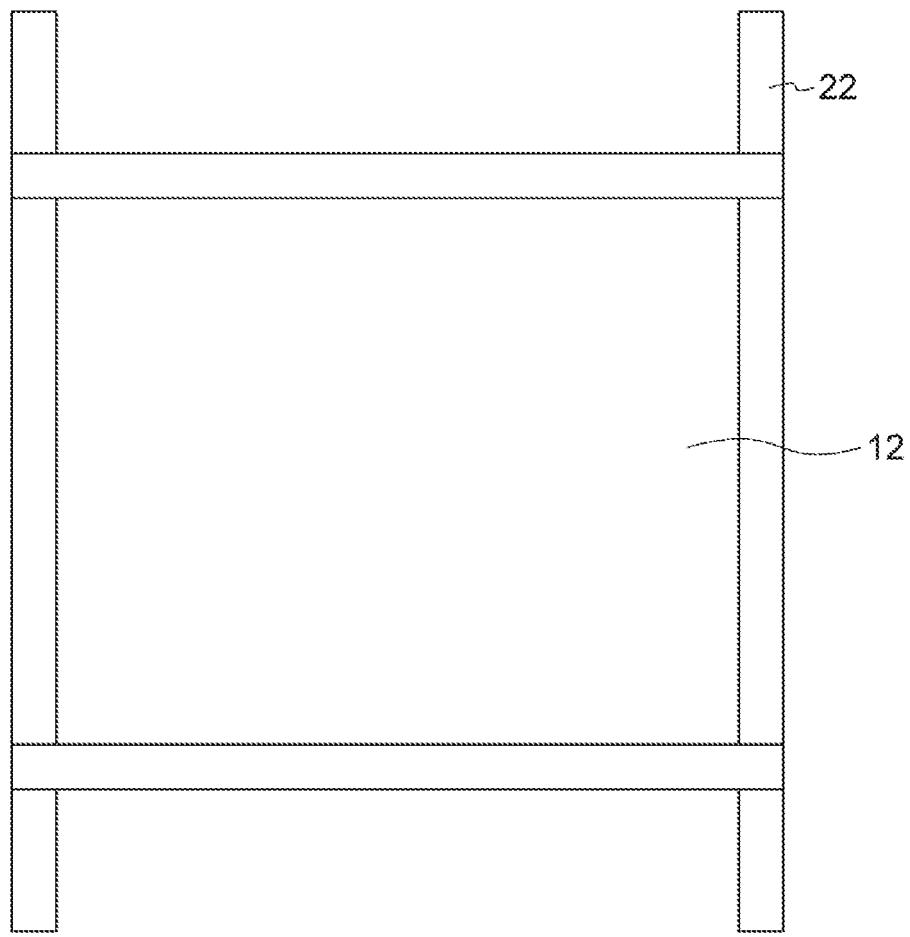
FIG. 10B is a schematic top view of the support and the glass carrier disposed on the support illustrated in FIG. 10A.
Figure 11A:
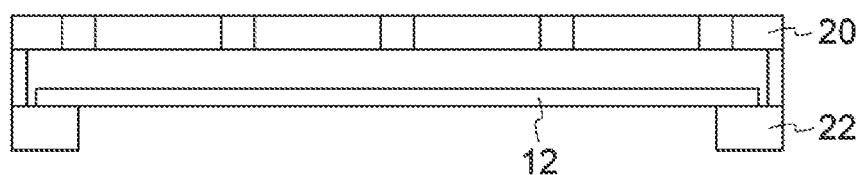
FIG. 11A is a schematic cross-sectional view illustrating the support, and the glass carrier and the frame disposed on the support.
Figure 11B:
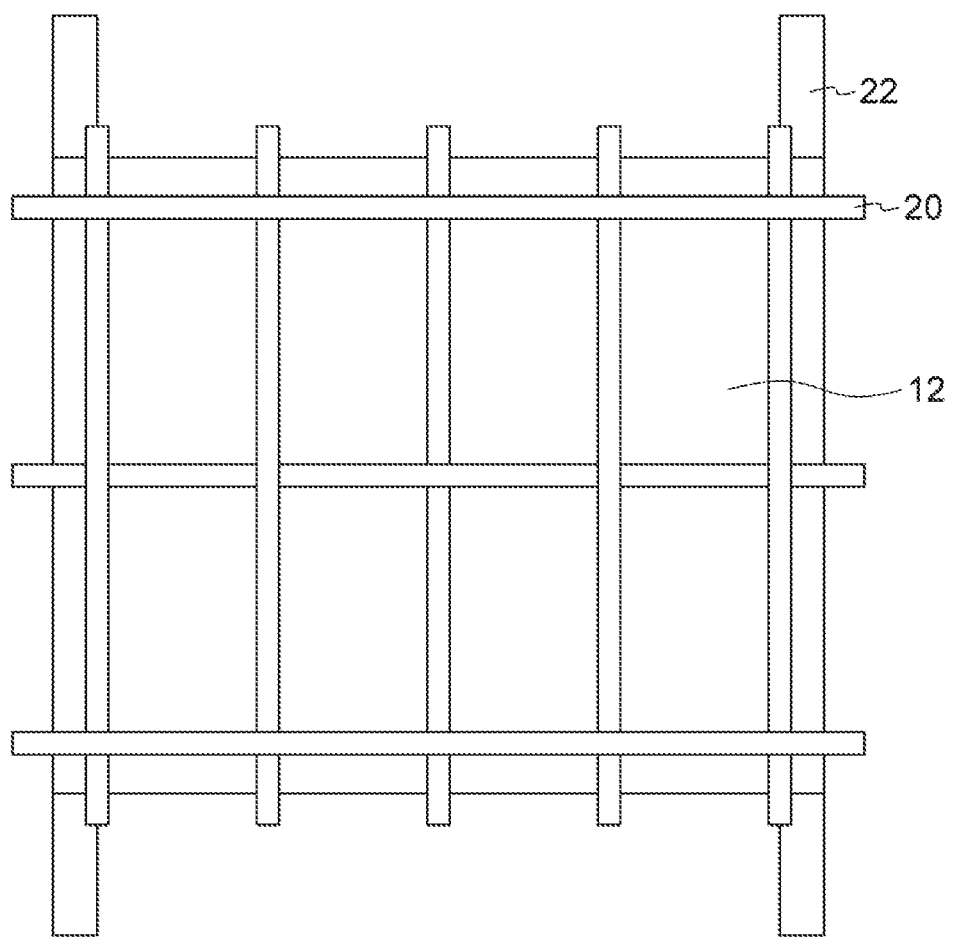
FIG. 11B is a schematic top view of the support, and the glass carrier and the frame disposed on the support illustrated in FIG. 11A.

As schematically illustrated in FIGS. 10A and 10B, a glass carrier 12 was disposed on a support 22. As schematically illustrated in FIGS. 11A and 11B, a frame 20 having a lattice pattern and composed of a stainless steel (SUS) with a width of 2.5 mm and a thickness of 0.3 mm was disposed at a distance of 2 mm above the glass carrier 12. While the frame 20 was held at a distance of 2 mm above the glass carrier 12 in this manner, layers were formed, which will be described below.

(3) Forming Ti-Containing Sublayer

A Ti-containing sublayer was formed on the glass carrier 12 in a sputtering system under the following conditions so as to have a thickness of 100 nm in areas not hidden by the frame 20:

System: a single-wafer magnetron sputtering system (MLS464 available from Canon Tokki Corporation)
Target: a Ti (purity: 99.999%) target with a diameter of 8 inches (203.2 mm)
Ultimate vacuum: below $1\times10^{-4}$ Pa
Carrier gas: Ar (flow rate: 100 sccm)
Sputtering pressure: 0.35 Pa
Sputtering power: 1000 W (3.1 W/cm$^2$)
Deposition temperature: 40° C.

(4) Forming Cu-Containing Sublayer

A Cu-containing sublayer was formed on the Ti-containing sublayer in a sputtering system under the following conditions so as to have a thickness of 100 nm in the areas not hidden by the frame 20.

System: a single-wafer DC sputtering system (MLS464 available from Canon Tokki Corporation)
Target: a copper (purity: 99.98%) target with a diameter of 8 inches (203.2 mm)
Ultimate vacuum: below $1\times10^{-4}$ Pa
Gas: gaseous argon (flow rate: 100 sccm)
Sputtering pressure: 0.35 Pa
Sputtering power: 1000 W (6.2 W/cm$^2$)
Deposition temperature: 40° C.

(5) Forming Carbon Layer

A release layer 16 of amorphous carbon was formed on the Cu-containing sublayer in a sputtering system under the following conditions so as to have a thickness of 6 nm in the areas not hidden by the frame 20.

System: a single-wafer DC sputtering system (MLS464 available from Canon Tokki Corporation)
Target: a carbon (purity: 99.999%) target with a diameter of 8 inches (203.2 mm)
Ultimate vacuum: below $1\times10^{-4}$ Pa
Carrier gas: Ar (flow rate: 100 sccm)
Sputtering pressure: 0.35 Pa
Sputtering power: 250 W (0.7 W/cm$^2$)
Deposition temperature: 40° C.

(6) Forming Functional Layer

A functional layer 17 of titanium was formed on the sample produced in Step (5) (on an exposed face of the release layer 16 or the Cu-containing sublayer) in a sputtering system under the following conditions so as to have a thickness of 100 nm in the areas not hidden by the frame 20:

System: a single-wafer DC sputtering system (MLS464 available from Canon Tokki Corporation)
Target: a titanium (purity of 99.999%) target with a diameter of 8 inches (203.2 mm)
Carrier gas: Ar (flow rate: 100 sccm)
Ultimate vacuum: below $1\times10^{-4}$ Pa
Sputtering pressure: 0.35 Pa
Sputtering power: 1000 W (3.1 W/cm$^2$)

(7) Forming Superthin Copper Layer

A copper layer 18 was formed on the functional layer 17 in a sputtering system under the following conditions so as to have a thickness of 300 nm in the areas not hidden by the frame 20, resulting in a glass carrier-attached copper foil 10:

System: a single-wafer DC sputtering system (MLS464 available from Canon Tokki Corporation)
Target: a copper (purity: 99.98%) target with a diameter of 8 inches (203.2 mm)
Ultimate vacuum: below $1\times10^{-4}$ Pa
Carrier gas: Ar (flow rate: 100 sccm)
Sputtering pressure: 0.35 Pa
Sputtering power: 1000 W (3.1 W/cm$^2$)
Deposition temperature: 40° C.

(8) Evaluation

The produced glass carrier-attached copper foil 10 was evaluated as shown below.

<Evaluation 1: Tape Releasing Test>

An adhesive tape (a cellophane tape) was attached to the copper layer 18 of the glass carrier-attached copper foil 10 and then released. The separation of the functional layer 17 and the copper layer 18 accompanied by release of the adhesive tape was observed. As a result, the separation of the functional layer 17 and the copper layer 18 was found in the areas not hidden by the frame 20 whereas the separation of the functional layer 17 and the copper layer 18 was not found in the area hidden by the frame 20. This demonstrates formation of the releasable regions R in the areas not hidden by the frame 20 and formation of the unreleasable region U in the area hidden by the frame 20, in the glass carrier-attached copper foil 10.

<Evaluation 2: Semi-Quantitative Analysis of Release Layer>

Elemental analysis of the glass carrier-attached copper foil 10 was carried out by energy-dispersive X-ray spectroscopy using scanning transmission electron microscopy (STEM-EDS) under the following conditions:

(Conditions for Measurement)
Analyzer: scanning transmission electron microscope (STEM) (JEM-ARM200F available from JEOL Ltd.)
Accelerating voltage: 200 kV
Observed area: 100 nm by 100 nm (extracted data of a line profile)
Observed elements: C, O, Ti, and Cu (Conditions for Analysis)
STEM-EDS data was analyzed with data analysis software ("NSS4.1" available from Thermo Fisher Scientific).

Figure 12:
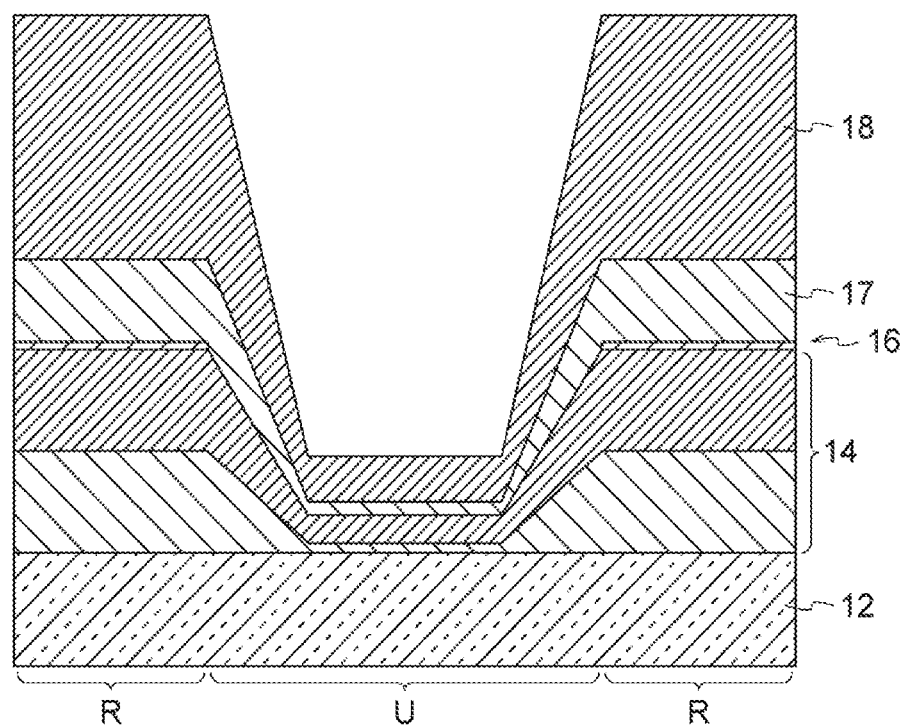
FIG. 12 is a schematic cross-sectional view of the carrier-attached copper foil produced in Example 1 after the carrier-attached copper foil is processed.

This analysis was carried out by processing the glass carrier-attached copper foil 10 and then analyzing each cross-section of the releasable regions R not hidden by the frame 20 and the unreleasable region U hidden by the frame 20, from the Cu-containing sublayer of the intermediate layer 14 to the functional layer 17 (a titanium layer), as illustrated in FIG. 12. Regarding the unreleasable region U, the analysis was carried out in the vicinity of the center of an area hidden by the frame 20 (in other words, at a position inward by 1.25 mm from an edge of the frame 20.

Figure 13A:
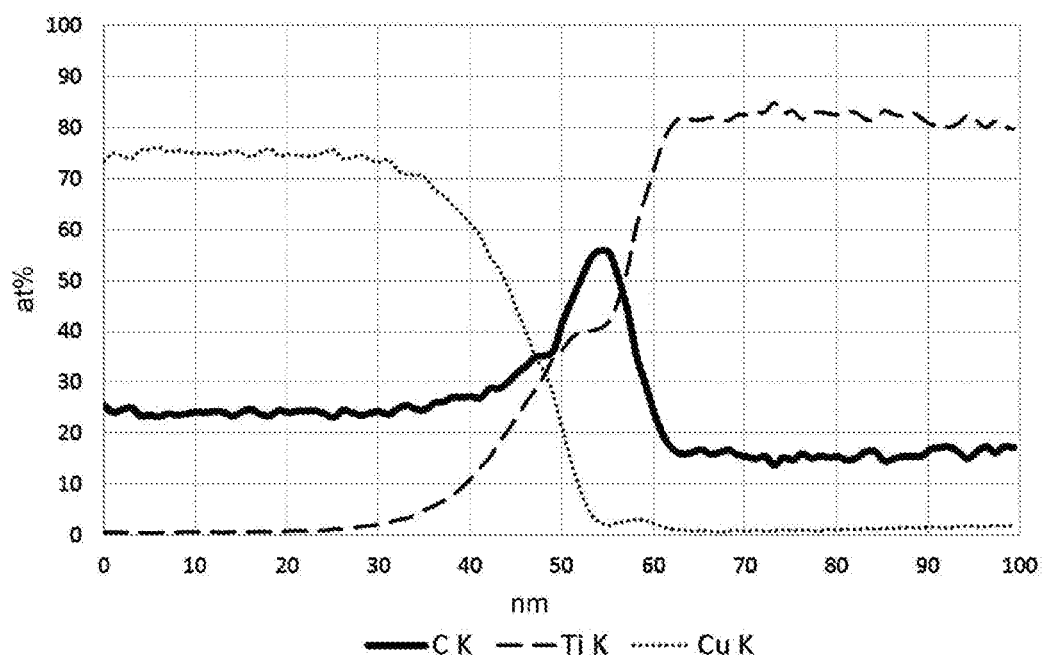
FIG. 13A is a graph showing the results of a semi-quantitative analysis by energy-dispersive X-ray spectroscopy using scanning transmission electron microscopy (STEM-EDS) of a releasable region of the carrier-attached copper foil produced in Example 1.
Figure 13B:
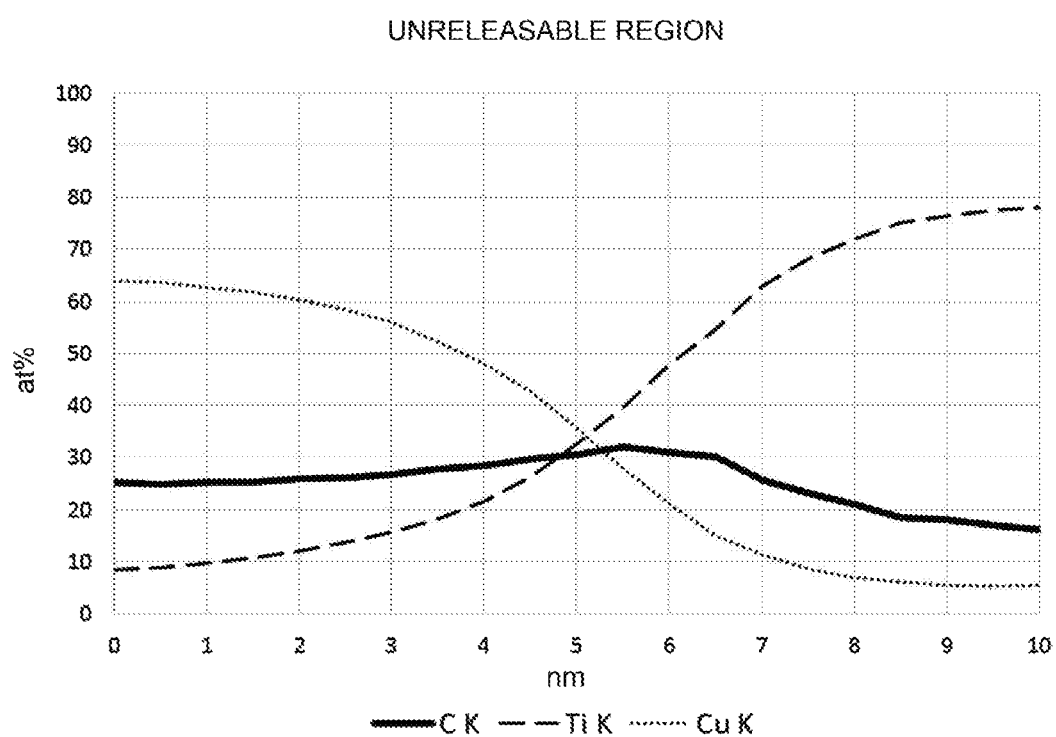
FIG. 13B is a graph showing the results of a semi-quantitative analysis by STEM-EDS of an unreleasable region of the carrier-attached copper foil produced in Example 1.

FIG. 13A (for the releasable region R) and the FIG. 13B (for the unreleasable region U) show the results of the semi-quantitative value of the depth profile of carbon from the Cu-containing sublayer of the intermediate layer 14 to the functional layer 17 (a titanium layer). FIG. 13A demonstrates that the releasable region R have a clear peak assigned to carbon and thus it is confirmed that there is a region mainly containing carbon in the cross-sectional direction, in other words, that the release layer 16 is actually exists. In contrast, FIG. 13B demonstrates that the unreleasable region U has no clear peak assigned to carbon and thus it was confirmed that there is no region mainly containing carbon, in other words, that the release layer 16 does not actually exist.

The invention claimed is:

1. A glass carrier-attached copper foil comprising:
a glass carrier;
a release layer provided on the glass carrier;
an intermediate layer between the glass carrier and the release layer; and
a copper layer provided on the release layer,
wherein the release layer has a function to enable release of the copper layer from the glass carrier,
wherein the glass carrier-attached copper foil has a plurality of releasable regions including the release layer and an unreleasable region not including the release layer, the unreleasable region having a pattern defining the releasable regions,
wherein, with respect to a plan view of the glass carrier-attached copper foil, the copper layer is superposed with the release layer and the glass carrier so as to cover at least portions of both the plurality of releasable regions and the unreleasable region,
wherein the unreleasable region has a discontinuous pattern,
wherein a surface of the intermediate layer is inclined to define an inclined surface in which a thickness of the intermediate layer decreases at least at a portion of the unreleasable region, and
wherein the copper layer covers the inclined surface.

2. The glass carrier-attached copper foil according to claim 1, wherein the intermediate layer comprises at least one metal selected from the group consisting of Cu, Ti, Al, Nb, Zr, Cr, W, Ta, Co, Ag, Ni, In, Sn, Zn, Ga, and Mo.

3. The glass carrier-attached copper foil according to claim 1, further comprising a functional layer between the release layer and the copper layer, the functional layer composed of at least one metal selected from the group consisting of Ti, Al, Nb, Zr, Cr, W, Ta, Co, Ag, Ni, and Mo.

4. The glass carrier-attached copper foil according to claim 1, wherein the copper layer has a thickness of 0.05 to 3.0 μm and a maximum height Rz of less than 1.0 μm as measured in accordance with JIS B0601-2001.

5. The glass carrier-attached copper foil according to claim 1, wherein the glass carrier is made of glass comprising $SiO_2$.

6. The glass carrier-attached copper foil according to claim 1, wherein the pattern of the unreleasable region has a width of 1 to 50 mm.

7. The glass carrier-attached copper foil according to claim 1, wherein the unreleasable region has a lattice pattern, a fence pattern, or a cruciform pattern.

8. The glass carrier-attached copper foil according to claim 1, wherein the discontinuous pattern includes discrete units each having at least one shape selected from the group consisting of a circle, an ellipse, a polygon, and a star polygon.

9. The glass carrier-attached copper foil according to claim 8, wherein the discrete units of the discontinuous pattern each have an area of 100 $mm^2$ or less.

10. The glass carrier-attached copper foil according to claim 1, wherein the ratio of the area of the unreleasable region to the total area of the releasable regions and the unreleasable region is 0.01 to 0.5.

11. The glass carrier-attached copper foil according to claim 1, wherein the unreleasable region is designed to be cut along the pattern such that the glass carrier-attached copper foil is divided into a plurality of pieces.

12. A method of producing the glass carrier-attached copper foil according to claim 1, comprising:
providing the glass carrier;
disposing a frame at a predetermined distance above a surface of the glass carrier, the frame having a pattern defining a plurality of regions;
forming the release layer and the copper layer in sequence on the glass carrier by physical vapor deposition (PVD) while holding the frame above the glass carrier, such that the unreleasable region not including the release layer is formed in an area hidden by the frame whereas the releasable regions including the release layer are formed in areas not hidden by the frame,
wherein the release layer is deposited to a thickness smaller than that of the copper layer to suppress invasion and deposition of components of the release layer in the area hidden by the frame so as to prevent formation of the release layer in the area hidden by the frame whereas the copper layer is deposited to a thickness larger than that of the release layer to facilitate invasion and deposition of copper in the area hidden by the frame so as to form the copper layer in the area hidden by the frame, and
wherein the distance between the frame and the glass carrier and a width of the frame are determined so as to prevent the formation of the release layer in the area hidden by the frame and to allow the formation of the copper layer in the area hidden by the frame.

13. The method according to claim 12, wherein the frame and/or the glass carrier are supported by a mechanism adjusting the distance between the frame and the glass carrier.

14. The method according to claim 12, wherein the frame has an inversely tapered cross-section whose width increases with distance from the surface of the glass carrier, or the frame has a tapered cross-section whose width decreases with distance from the surface of the glass carrier.

15. The method according to claim 12, wherein the frame is composed of a metal.

16. A method of producing the glass carrier-attached copper foil according to claim 1, comprising:
providing the glass carrier;
forming the release layer and the copper layer in sequence on the glass carrier to yield a tentative glass carrier-attached copper foil, an entire region of which is covered with the release layer and the copper layer; and
heating the tentative glass carrier-attached copper foil along a pattern defining a plurality of regions such that the release layer present in a region corresponding to the pattern selectively disappears or malfunctions, thereby forming the unreleasable region not including the release layer and the releasable regions including the release layer that remains.

17. The method according to claim 16, wherein the heating is carried out by laser beam irradiation.

18. The method according to claim 16, wherein the release layer and the copper layer are formed by physical vapor deposition (PVD).

* * * * *